United States Patent
Ahn

(10) Patent No.: US 6,242,311 B1
(45) Date of Patent: Jun. 5, 2001

(54) METHOD OF FABRICATING A SEMICONDUCTOR DEVICE WITH SILICIDED GATES AND PERIPHERAL REGION

(75) Inventor: Jae Gyung Ahn, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/145,136

(22) Filed: Sep. 1, 1998

(30) Foreign Application Priority Data

Sep. 26, 1997 (KR) ................................. 95-749218

(51) Int. Cl.$^7$ ............................................... H01L 21/8234
(52) U.S. Cl. ........................... 438/275; 438/592; 438/655
(58) Field of Search .................................. 438/200, 241, 438/275, 296, 299, 303, 592, 633, 655

(56) References Cited

U.S. PATENT DOCUMENTS

| | | | |
|---|---|---|---|
| 5,620,919 | * 4/1997 | Godinho et al. | 438/303 |
| 5,719,079 | * 2/1998 | Yoo et al. | 438/241 |
| 5,930,618 | * 7/1999 | Sun et al. | 438/241 |
| 5,946,573 | * 8/1999 | Hsu | 438/592 |
| 5,953,612 | * 9/1999 | Lin et al. | 438/592 |

OTHER PUBLICATIONS

M.T. Takagi et al., "A Novel 0.15 $\mu$CMOS Technology using W/Wnx/Polysilicon Gate Electrode and Ti Silicided Source/Drain Diffusions;" 1996 IEEE, IEDM 96–455; pp. 17.6.1–17.6.4.

* cited by examiner

Primary Examiner—Chandra Chaudhari
(74) Attorney, Agent, or Firm—Fleshner & Kim, LLP

(57) ABSTRACT

A method of fabricating a semiconductor device or a substrate having a cell region and a peripheral region includes the step of selectively forming a trench between the cell region and the peripheral region, and forming an isolation layer in the trench. Next, a plurality of gate electrodes are formed on the semiconductor substrate. Lightly doped regions are formed in the semiconductor substrate using the gate electrodes as a mask. Spacers are formed on sides of each of the gate electrodes. A first insulating layer is formed on the cell region of the semiconductor device such that surfaces of the gate electrodes on the cell region remain exposed. A conductivity of the peripheral region of the semiconductor substrate is altered using the first insulating layer, the gate electrodes and the spacers as a mask. Silicide layers are formed on the peripheral region of the substrate and the gate electrodes. A planarization layer is formed on the overall surface of the device, including the silicide layer, and contact holes are formed to expose portions of the cell and peripheral regions of the substrate. Finally, a plurality of bit lines are formed on the second insulating layer, the bit lines extending into the contact holes.

26 Claims, 6 Drawing Sheets

METHOD OF FABRICATING A SEMICONDUCTOR DEVICE WITH SILICIDED GATES AND PERIPHERAL REGION

BACKGROUND OF THE INVENTION

1. Field of the Invention

The present invention relates to a method of fabricating a semiconductor device having an improved structure.

2. Background of the Related Art

As semiconductor devices become more highly integrated, the size of a MOS transistor becomes smaller, and the junction depth of its source/drain region becomes more shallow. As the junction depth of the source/drain region becomes more shallow, the sheet resistance increases because the sheet resistance of a junction is inversely proportional to the junction depth. This, in turn, raises parasitic resistance of the device.

To reduce the sheet resistance of a junction, a silicide layer may be formed on the shallow source/drain region. The silicide layer is roughly divided into a polycide formed by reaction of a refractory metal and polysilicon, and self-aligned silicide (SALICIDE) formed by reaction of a refractory metal and silicon. Titanium silicide ($TiSi_2$) is widely used as the silicide.

When the silicide layer is formed on the source/drain region, a portion of the source/drain region formed of silicon is consumed to a specific depth corresponding to the thickness of the silicide layer during the suicide forming process. Accordingly, a silicide formation technique which produces a thin silicide layer with stable characteristics is helpful in fabricating VLSI devices. Furthermore, when the silicide layer is formed on a shallow junction of a source/drain region, the boundary between the silicide and silicon should be even.

A background art method of fabricating a semiconductor device having a silicide layer is explained below with reference to the attached drawings. FIGS. 1A to 1H are cross-sectional views showing a semiconductor after steps of a background method of fabricating a conventional semiconductor device have been performed.

Referring to FIG. 1A, a semiconductor substrate 1 having a cell region and a peripheral region is first prepared. A predetermined region between the cell region and peripheral region is etched through photolithography to a predetermined depth, to form a trench which is used as an isolation region. A first insulating layer 2 is formed on the overall surface of the substrate, including the trench, and is then etched back so that the first insulating layer 2 is only in the trench.

Referring to FIG. 1B, a second insulating layer 3, a first polysilicon layer 4, a third insulating layer 5, a metal layer 6 and a fourth insulating layer 7 are sequentially formed on the overall surface of the substrate 1, including the first insulating layer 2. Here, second insulating layer 3, which is used as a gate insulating layer, is formed of an oxide layer, the third insulating layer 5 is formed of TiN, and the fourth insulating layer 7 is a cap oxide layer.

Referring to FIG. 1C, a first photoresist is deposited on the fourth insulating layer 7, and patterned through exposure and development, to form a first photoresist pattern PR1 defining gate electrode regions. The fourth insulating layer 7, metal layer 6, third insulating layer 5 and polysilicon layer 4 are selectively removed, using the first photoresist pattern PR1 as a mask, to form a plurality of gate electrodes 8a and 8b.

Referring to FIG. 1D, the first photoresist pattern PR1 is removed, and impurity ions are implanted in a low concentration into the substrate, using gate electrodes 8a and 8b as a mask, to form LDD regions 9. A fifth insulating layer is formed on the overall surface of the substrate, including gate electrodes 8a and 8b, and is then etched back to form fifth insulating layer spacers 10a and 10 b on the sides of gate electrodes 8a and 8b. Second insulating layer 3 is then selectively etched using the fifth insulating layer spacers 10a and 10b as a mask. Here, fifth insulating layer spacers 10a and 10b are formed of a nitride layer for self-aligned contact in the following process.

Referring to FIG. 1E, a second photoresist is deposited on the overall surface of the substrate 1, including the fifth insulating layer spacers 10a and 10b, and is patterned through exposure and development to form a second photoresist pattern PR2 only on the cell region. Impurity ions are implanted in a high concentration into the exposed portions of the substrate, using the second photoresist pattern PR2, gate electrode 8b and fifth insulating layer spacer 10b as a mask, to form a source/drain region 11 in the peripheral region.

Referring to FIG. 1F, the second photoresist pattern PR2 is then removed, and a sixth insulating layer 12 for planarization is formed on the overall surface of the substrate. Thereafter, a third photoresist is deposited on the sixth insulating layer 12, and patterned through exposure and development to form a third photoresist pattern PR3 only on the cell region. A portion of the sixth insulating layer 12 overlying the peripheral region is then selectively removed using the third photoresist pattern PR3 as a mask.

Referring to FIG. 1G, the third photoresist pattern PR3 is then removed, a second metal layer is formed on the overall surface of the substrate, and a silicide layer 13 is formed on the source/drain region 11 in the peripheral region, using heat treatment. Then, the remaining portions of the second metal layer are removed through a cleaning process, and a seventh insulating layer 14 is formed on the overall surface of the substrate to planarize the substrate. Portions of the sixth and seventh insulating layers 12 and 14 are then selectively removed to expose portions of the silicide layer 13 of the peripheral region and portions of the LDD region 9 of the cell region, thereby forming a plurality of contact holes 15. Referring to FIG. 1H, a third metal layer is formed on seventh insulating layer 14, including the contact holes 15, and is selectively removed, to form a plurality of bit lines 16.

The method of fabricating the background art semiconductor device has several problems. Source/drain leakage current increases when the silicide layer is formed on the source/drain region of the transistor. Furthermore, because it is desirable for the gate region of the transistor to have a low sheet resistance, a metal layer (or polycide layer) must be formed on the gate electrode, and a silicide formation process must be carried out while a protection layer is formed on the cell region. This complicates the gate structure and the overall device formation process. Moreover, variations in channel doping may occur due to heat cycling during the silicide formation process.

SUMMARY OF THE INVENTION

The present invention is directed to methods of fabricating a semiconductor device that substantially obviate one or more of the problems, limitations and disadvantages of the background art.

An object of the present invention is to provide a shallower junction and lower sheet resistance.

Another object of the present invention is to provide a method of fabricating a semiconductor device which prevents a silicide layer from being formed on a cell region of a transistor, while simultaneously allowing formation of a silicide layer on the gate of the transistor to reduce the sheet resistance of the gate.

The present invention can be achieved in a whole or in part by a method that includes the steps of: providing a substrate having a cell region and a peripheral region; forming at least one gate electrode on the cell region of the semiconductor substrate; and forming silicide layers on a top surface of the gate electrode and a portion of the peripheral region. Alternate methods embodying the invention may also include the steps of: forming lightly doped (LDD) regions in the semiconductor substrate using gate electrodes as a mask; forming spacers on the sides of each of the gate electrodes; forming a first insulating layer on the cell region of the semiconductor such that surfaces of the gate electrodes are exposed; altering a conductivity of a source/drain region in the peripheral region of the semiconductor substrate using the first insulating layer and spacers as a mask; forming a second insulating layer for planarization on the overall surface of the semiconductor substrate including the silicide layer; forming contact holes to expose portions of the LDD region of the cell region and portions of the source/drain region in the peripheral region; and forming a plurality of bit lines on the second insulating layer, including the contact holes.

Another method embodying the invention includes the steps of: forming at least one gate electrode on a peripheral region of a substrate; forming an insulating layer over a cell region of the substrate; altering a conductivity of at least one portion of the peripheral region of the substrate using the insulating layer as a mask; and forming silicide layers on a top surface of the at least one electrode; and on a portion of the substrate in the peripheral region using the insulating layer as a mask.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1A:
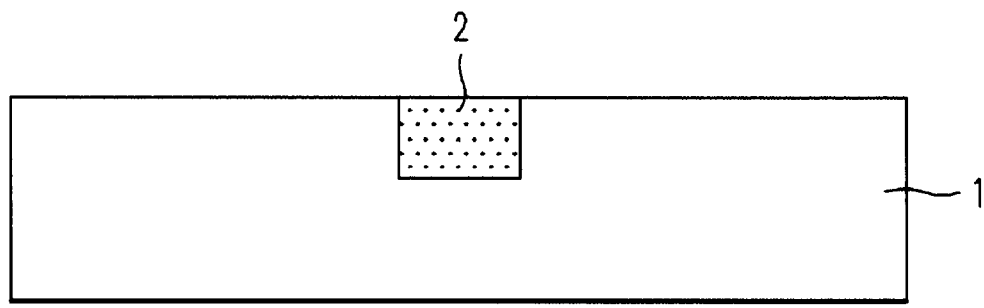
FIGS. 1A to 1H are cross-sectional views showing steps of a background art method of fabricating a semiconductor device.
Figure 1B:
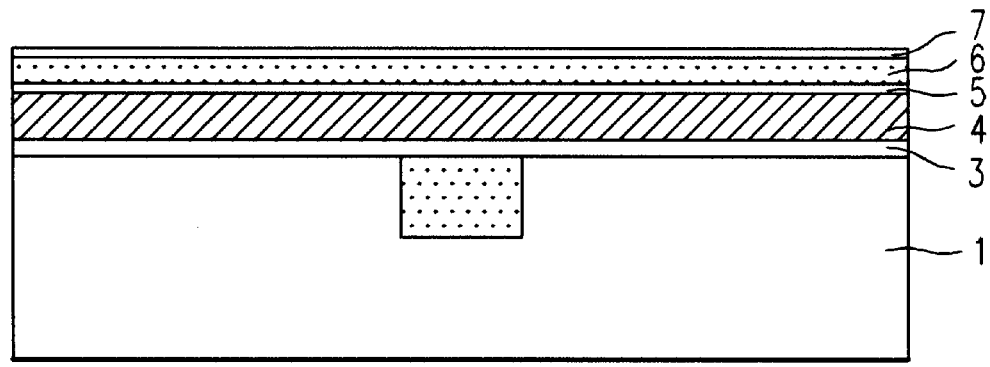
Figure 1C:
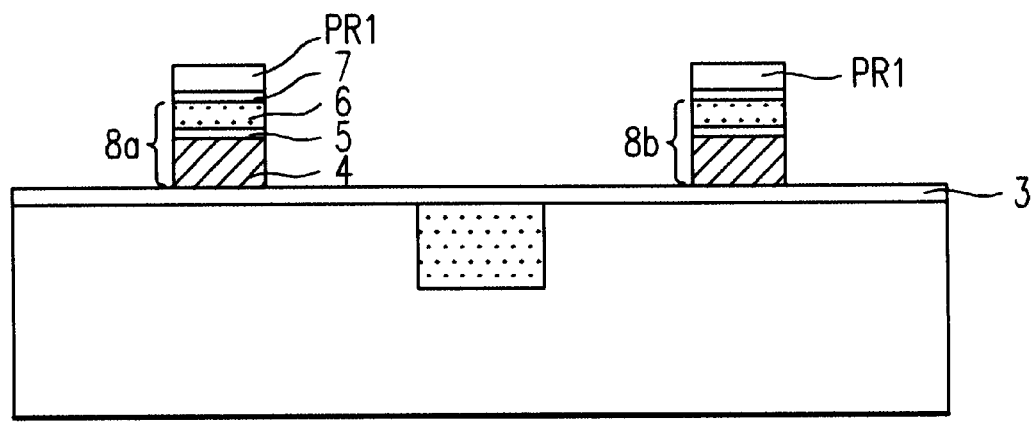
Figure 1D:
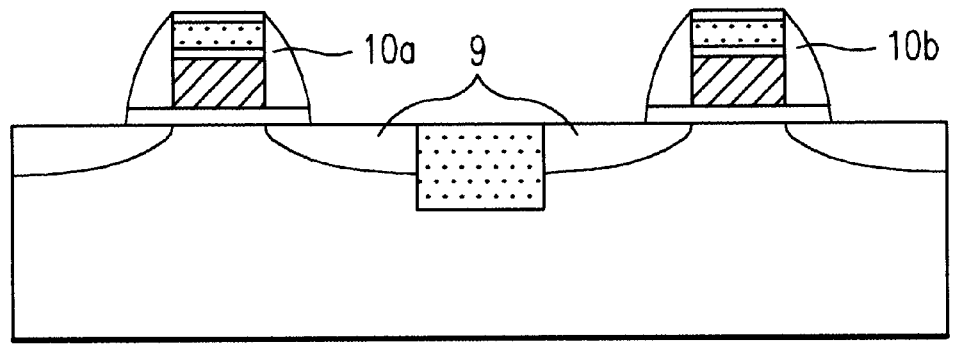
Figure 1E:
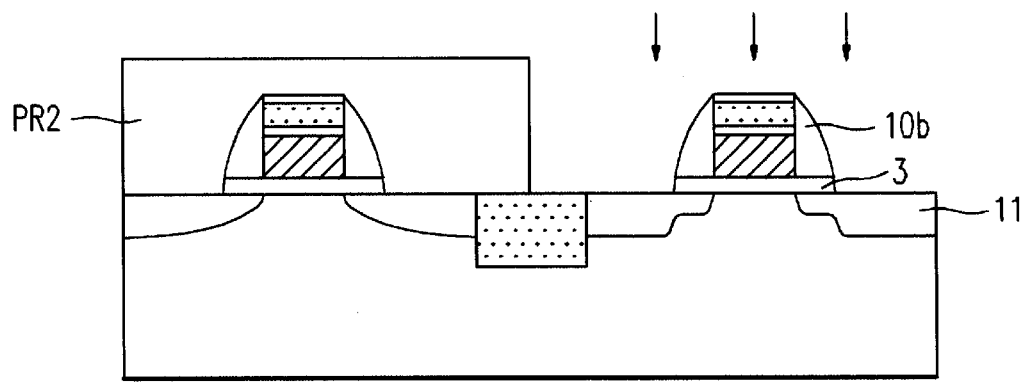
Figure 1F:
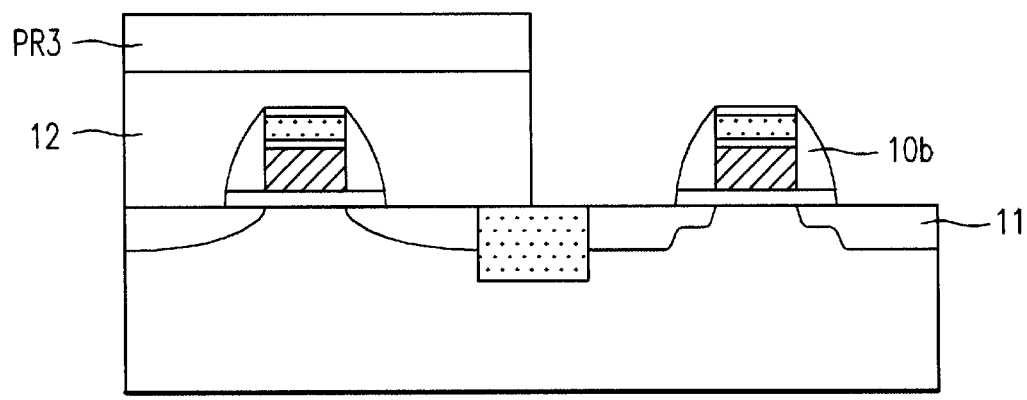
Figure 1G:
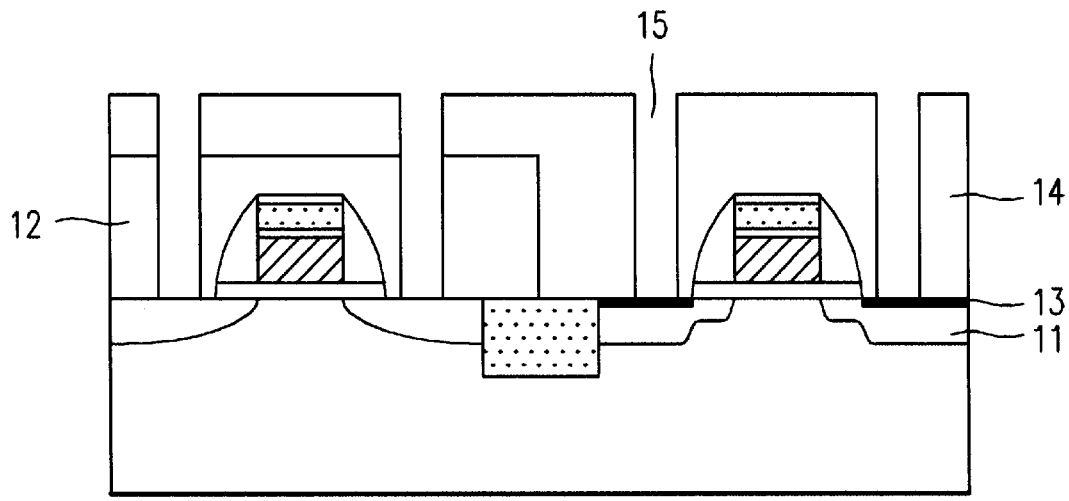
Figure 1H:
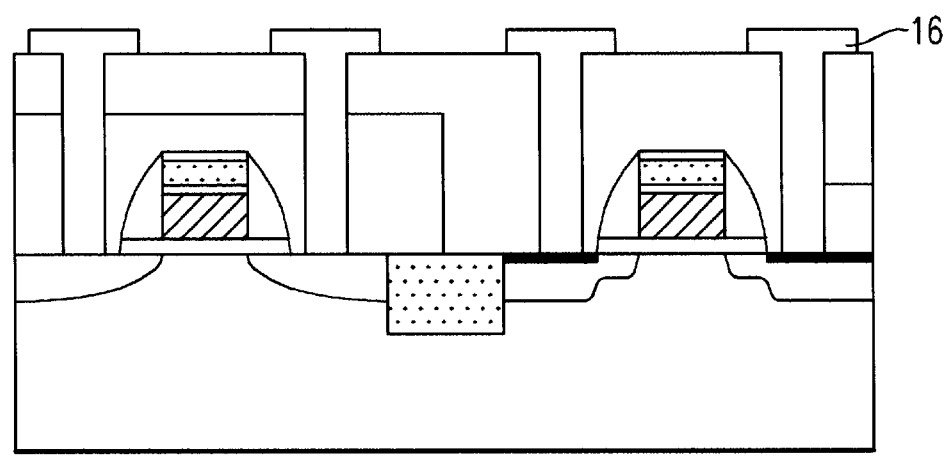
Figure 2A:
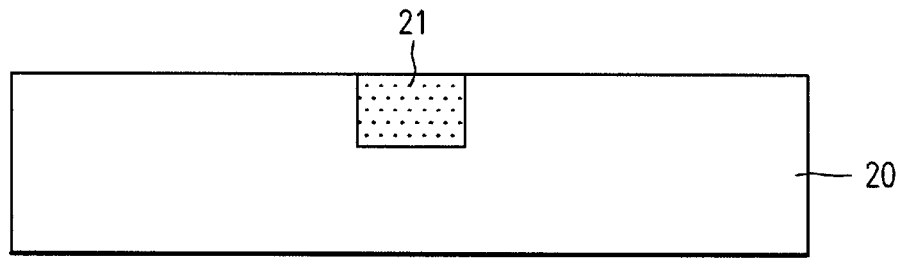
FIGS. 2A to 2G are cross-sectional views showing steps of a method of fabricating a semiconductor device according to a preferred embodiment of the present invention.

Referring to FIG. 2A, a semiconductor substrate 20 having a cell region and peripheral region is prepared, and a predetermined region between the cell region and peripheral region is etched through photolithography to a predetermined depth to form a recess, preferably a trench. A first insulating layer 21 is formed on the overall surface of the substrate, including the trench, and is etched back to form an isolation region 21.

Figure 2B:
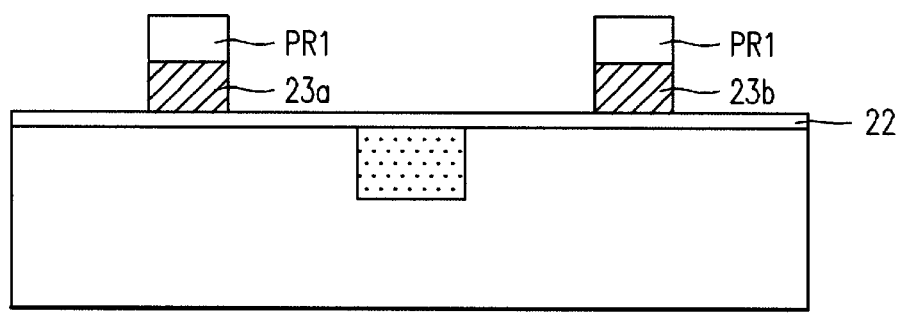

Referring to FIG. 2B, a second insulating layer 22 and a polysilicon layer are sequentially formed on the overall surface of the substrate 20, including the first insulating layer 21. A first photoresist is deposited on the polysilicon layer, and patterned through exposure and development, to form a first photoresist pattern PR1. Then, the polysilicon layer is selectively removed using the first photoresist pattern PR1 as a mask to form a plurality of gate electrodes 23a and 23b. Here, the second insulating layer 22, which is a gate insulating layer, is formed of an oxide layer.

Figure 2C:
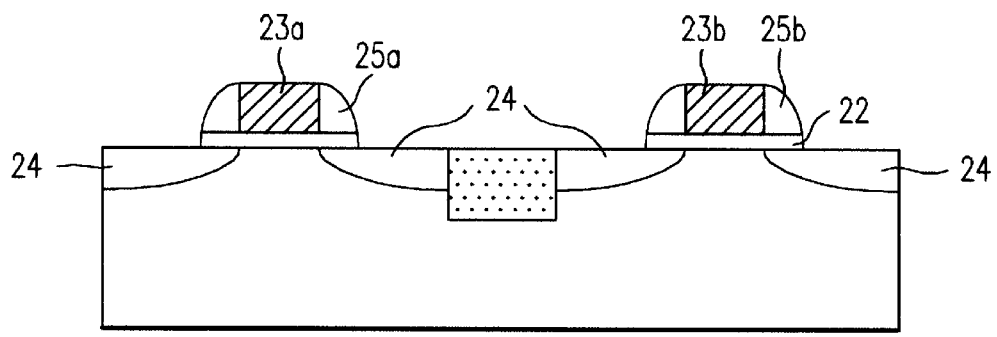

Referring to FIG. 2C, the first photoresist pattern PR1 is removed, and impurity ions are implanted in a low concentration into the substrate, using the gate electrodes 23a and 23b as a mask, to form LDD regions 24. A third insulating layer is formed on the overall surface of the substrate, including the gate electrodes 23a and 23b, and is then etched back to form third insulating layer spacers 25a and 25b on the sides of the gate electrodes 23a and 23b. The second insulating layer 22 is then selectively etched using the gate electrodes 23a and 23b and the third insulating layer spacers 25a and 25b as a mask. Here, the third insulating layer spacers 25a and 25b are formed of a nitride layer for self-aligned contact in the following process.

Figure 2D:
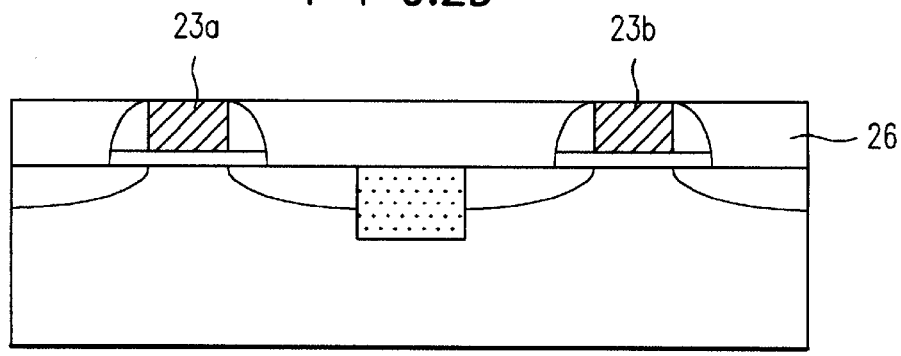

Referring to FIG. 2D, a fourth insulating layer 26 for planarization is formed on the overall surface of the substrate 20, including the third insulating layer spacers 25a and 25b, and a chemical mechanical polishing (CMP) process is performed on the fourth insulating layer 26 to expose top surfaces of gate electrodes 23a and 23b. Here, the fourth insulating layer 26 may be formed of undoped silicate glass (USG) or tetraethyl-orthosilicate (TEOS). Alternatively, an etch back process can be used instead of the CMP process.

Figure 2E:
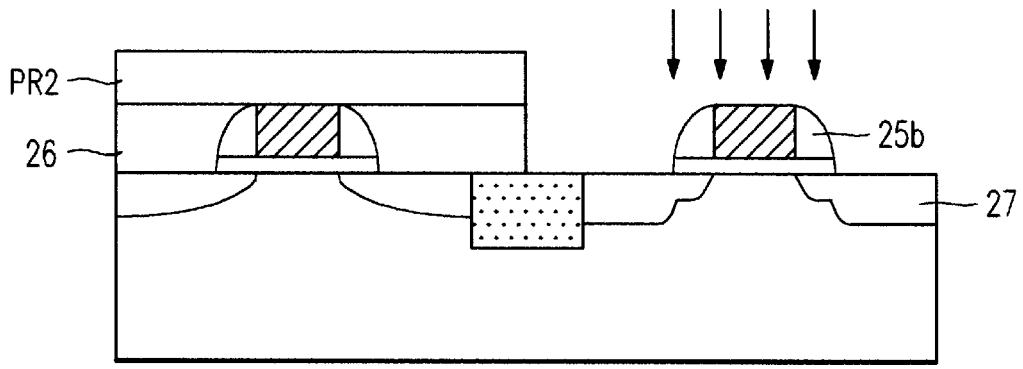

Referring to FIG. 2E, a second photoresist is deposited on the fourth insulating layer 26, and is patterned through exposure and development, to form a second photoresist pattern PR2 only over the cell region. The fourth insulating layer 26 is then selectively removed using the second photoresist pattern PR2 as a mask. Thereafter, the second photoresist pattern PR2 is removed, and impurity ions are implanted in a high concentration into the substrate, using the gate electrode 23b, the third insulating layer spacer 25b and the remaining portion of the fourth insulating layer 26 as a mask, to form a source/drain region 27 in the peripheral region.

Figure 2F:
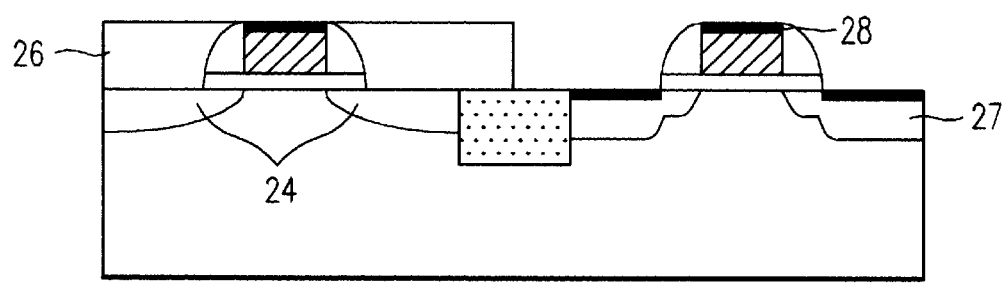

Referring to FIG. 2F, a first metal layer is then formed on the overall surface of the substrate, including the fourth insulating layer 26, and silicide layers 28 are formed on the top surface of the gate electrodes 23a and 23b, and on the source/drain region 27 in the peripheral region, using a heat treatment process. The first metal layer is formed of a refractory metal. Then, the remaining portions of the first metal layer are removed through a cleaning process.

Figure 2G:
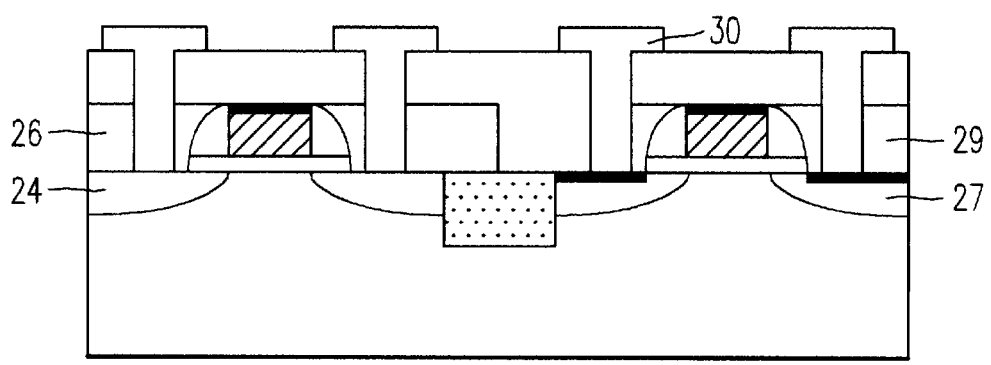

Referring to FIG. 2G, a fifth insulating layer 29 is formed on the overall surface of the substrate, including the silicide layer 28, thus planarizing the substrate. Portions of the fourth and fifth insulating layers 26 and 29 are selectively removed so as to expose portions of the LDD region 24 of the cell region, and portions of the source/drain region of the peripheral region, thus forming a plurality of contact holes. A second metal layer is formed on the fifth insulating layer 29 including the contact holes, and is selectively removed, to form a plurality of bit lines 30.

In an alternate embodiment, when a silicide layer is required in a portion of the input/output region of the device which is non-silicide active, the source/drain region 27 is formed first in both the cell region and peripheral region, and then fourth insulating layer 26 is formed to expose the surface of gate electrodes 23a and 23b. Thereafter, the silicide layer 28 is formed on gate electrodes 23a and 23b.

The method of fabricating a semiconductor device according to the present invention has the following advantages. First, the sheet resistance of the gate electrode of the cell region can be reduced using the silicide formation process without using metal gate electrodes. Because the gate electrodes are formed by etching only polysilicon layers, the fabrication process is simplified. Also, a silicide gate electrode can be formed even in the input/output region, non-silicide active region, of an ESD protection circuit of a semiconductor device. Furthermore, since the impurities for forming the source/drain region are blocked by the insulating layer over the cell region, there is no need to use two separate photoresist masks for forming the LDD region and the source/drain region.

It will be apparent to those skilled in the art that various modifications and variations can be made to the above-described method of fabricating a semiconductor device without departing from the spirit or scope of the invention, as defined by the following claims. Thus, it is intended that the present invention cover such modifications and variations.

What is claimed is:

1. A method of forming a semiconductor device having a cell region and a peripheral region on a substrate, comprising:

forming at least one gate electrode on the peripheral region of the substrate;

forming at least one gate electrode on the cell region of the substrate;

forming an insulating layer over the cell region of the device such that only a top surface of the gate electrode in the cell region is exposed and the entire peripheral region is exposed; and forming silicide layers on top surfaces of the at least one gate electrode in the peripheral and cell regions, and on a portion of the peripheral region of the substrate.

2. The method of claim 1, further comprising the steps of:

forming a planarization layer on the device;

forming a plurality of contact holes in at least the planarization layer; and forming conductive regions in the contact holes.

3. The method of claim 2, wherein the contact holes expose at least one of a portion of the substrate in the cell region and a portion of the substrate in the peripheral region.

4. The method of claim 1, further comprising a step of forming an isolation region between the cell region and the peripheral region.

5. The method of claim 1, further comprising a step of altering a conductivity of portions of the cell region and the peripheral region of the substrate using the at least one gate electrode in the cell and peripheral regions as a mask.

6. The method of claim 5, further comprising a step of further altering a conductivity of a portion of the peripheral region of the substrate using at least the insulating layer as a mask.

7. The method of claim 6, wherein the step of further altering a conductivity of a portion of the peripheral region of the substrate comprises using the at least one gate electrode in the peripheral region as a mask.

8. The method of claim 1, further comprising a step of altering a conductivity of a portion of the peripheral region using at least the insulating layer as a mask.

9. The method of claim 7, further comprising a step of forming spacers on sides of the at least one gate electrode in the cell and peripheral regions before performing the step of forming an insulating layer, and wherein the step of altering a conductivity of a portion of the peripheral region also uses the at least one gate electrode in the peripheral region and its side spacers as a mask.

10. The method of claim 9, wherein the step of forming spacers comprises forming the spacers of a nitride.

11. The method of claim 1, wherein the step of forming an insulating layer comprises performing one of a chemical mechanical polishing process and an etch back process to leave a top surface of the at least one gate electrode in the cell region exposed.

12. The method of claim 1, wherein the step of forming an insulating layer comprises forming the insulating layer of at least one of TEOS and OSG.

13. The method of claim 1, wherein the step of forming at least one gate electrode in the peripheral region comprises forming the at least one gate electrode of polysilicon.

14. The method of claim 1, wherein the step of forming silicide layers comprises:

forming a metal layer on a surface of the device; and conducting a heat treatment process to form silicide layers on top surfaces of the at least one gate electrode in the peripheral and cell regions and on a portion of the peripheral region.

15. The method of claim 14, wherein the step of forming a metal layer comprises forming the metal layer of a refractory metal.

16. A method of forming a semiconductor device having a cell region and a peripheral region on a substrate, comprising:

forming at least one gate electrode on the peripheral region of the substrate;

forming at least one gate electrode on the cell region of the substrate;

forming source and drain regions on opposite sides of the gate electrodes in each of the peripheral and cell regions, and forming silicide layers on top surfaces of the at least one gate electrode in the cell and peripheral regions and on the source and drain regions of only one of the cell and peripheral regions.

17. The method of claim 18, further comprising the steps of:

forming an insulating layer over the cell region of the substrate such that a top surface of the at least one gate electrode in the cell region is exposed; and altering a conductivity of at least one portion of the peripheral region of the substrate using the insulating layer as a mask.

18. The method of claim 17, wherein the step of forming an insulating layer comprises the steps of:

forming the insulating layer over the cell region such that it completely covers the at least one gate electrode in the cell region; and performing at least one of a chemical mechanical polishing process and an etch back process to leave the top surface of the at least one gate electrode in the cell region exposed.

19. A method of forming a semiconductor device having a cell region and a peripheral region on a substrate, comprising:

forming at least one gate electrode in the peripheral region of the substrate;

forming at least one gate electrode in the cell region of the substrate;

forming source and drain regions on opposite sides of the gate electrodes in each of the peripheral and cell regions;

forming an insulating layer over only the cell region such that the insulating layer covers the source and drain regions in the cell region such that a top surface of the at least one gate electrode in the cell region is exposed and such that the entire peripheral region is exposed; and lowering a resistivity of the at least one gate electrode in the cell region.

20. The method of claim 19, wherein the step of forming an insulating layer comprises the steps of:

forming the insulating layer over the cell region such that it completely covers the at least one gate electrode in the cell region; and performing at least one of a chemical mechanical polishing process and an etch back process to leave a top surface of the at least one gate electrode in the cell region exposed.

21. The method of claim 19, wherein the step of lowering the resistivity of the at least one gate electrode in the cell region comprises forming silicide layers on top surfaces of the gate electrodes in both the cell and peripheral regions to thereby lower the resistivity of the at least one gate electrode in both the cell and peripheral regions.

22. The method of claim 1, wherein a source and a drain are formed on opposite sides of the gate electrodes in each of the cell and peripheral regions before forming an insulating layer, and wherein the step of forming silicide layers also results in the formation of silicide layers on the source and drain in the peripheral region.

23. The method of claim 19, further comprising lowering a resistivity of the source and drain regions in the peripheral region by forming silicide layers on the source and drain regions in the peripheral region.

24. The method of claim 17, wherein the steps of altering a conductivity of at least one portion of the substrate and forming a silicide layer also use the at least one gate electrode in the peripheral region as a mask.

25. The method of claim 16, further comprising the steps of:

forming a planarization layer over the device;

forming contact holes to expose a portion of the substrate; and forming conductive regions in the contact holes.

26. The method of claim 17, wherein the step of forming silicide layers includes forming a silicide layer on the exposed top surface of the gate electrode in the cell region.

* * * * *